United States Patent
Bettencourt

(10) Patent No.: US 7,852,136 B2
(45) Date of Patent: Dec. 14, 2010

(54) BIAS NETWORK

(75) Inventor: John P. Bettencourt, Danvers, MA (US)

(73) Assignee: Raytheon Company, Waltham, MA (US)

( * ) Notice: Subject to any disclaimer, the term of this patent is extended or adjusted under 35 U.S.C. 154(b) by 200 days.

(21) Appl. No.: 12/189,888

(22) Filed: Aug. 12, 2008

(65) Prior Publication Data

US 2010/0039168 A1 Feb. 18, 2010

(51) Int. Cl.
*H03K 17/687* (2006.01)
(52) U.S. Cl. .................... 327/427; 327/543; 327/560
(58) Field of Classification Search ................. 327/427,
327/538, 541, 543, 560; 330/285, 288, 296;
323/315, 316
See application file for complete search history.

(56) References Cited

U.S. PATENT DOCUMENTS

| | | | |
|---|---|---|---|
| 4,536,702 A * | 8/1985 | Nagano | 323/316 |
| 5,889,426 A | 3/1999 | Kawakami et al. | |
| 6,114,901 A | 9/2000 | Singh et al. | |
| 6,304,130 B1 | 10/2001 | Poulin et al. | |
| 2003/0155977 A1 * | 8/2003 | Johnson et al. | 330/290 |

OTHER PUBLICATIONS

Rajinder Singh, Hiroshi Nakamura, Khen-Sang Tan, Junichi Shibata, A 1.9 Fully Integrated PHS Power Amplifier With A Novel Automatic Gate-Bias Control Circuit, 1998, pp. 431-434, 1998 IEEE MTT-S Digest.

* cited by examiner

*Primary Examiner*—Long Nguyen
(74) *Attorney, Agent, or Firm*—Daly, Crowley, Mofford & Durkee, LLP

(57) ABSTRACT

A network having a current mirror comprising: a output transistor having a gate electrode for controlling a first current between a first electrode and a second electrode, the first electrode being coupled to a positive reference potential and the second electrode being connected to ground. A second transistor has a gate electrode for controlling a second current between a first electrode and a second electrode of the second transistor. The gate electrodes are connected together to produce the first current and the second current with equal current densities. A first portion of current from a current source is fed to the first electrode of the second transistor and a second portion of current from the current source is fed to a bias voltage producing circuit producing a bias voltage at the gate electrode of the output transistor for tracking variations in the first current passing through the output transistor.

13 Claims, 2 Drawing Sheets

BIAS NETWORK

TECHNICAL FIELD

This invention relates generally to integrated circuit design for semiconductor biasing circuits. In particular, it relates to maintaining predictable dc operating conditions which should be invariant with respect to process variations and power supply variations in the active transistors in the biasing circuit.

BACKGROUND

As is known in the art, an important requirement for "transistor" amplifier design is establishment of a stable DC operation condition of the associated transistors. MESFET and HEMT amplifiers are biased at a quiescent drain current to achieve desired performance. Setting this quiescent drain current (Idq) is usually accomplished by adjusting the DC voltage supplied to the gate of the transistor. Although in principle the gate voltage (Vg) can be determined readily from the drain current (Id) versus Vg transfer characteristic of a typical device, inherent sensitivities of the FET characteristics to fabrication process and temperature preclude using of a fixed Vg.

As is also know, a circuit for adjusting Vg preferably on a per amplifier basis should ensure that the quiescent drain current (Idq) is set near the nominal target value. Typical implementations include: supplying externally an individual Vg voltage to each amplifier; adding a resistor ladder network on chip to generate several candidate Vg voltages from a fixed supply voltage; screening and dividing parts into several Vg bins. All known options require some level of testing to determine first how each part or a group of parts has to be biased. Then assembly is tailored to that particular part or group of parts. These steps add significant time and cost to the product.

One technique suggested is described in U.S. Pat. No. 5,793,194, inventor Lewis issued Aug. 11, 1998 and assigned to the same assignee as the present invention. Such U.S. patent describes voltage bias and temperature compensation circuits. While such circuits operate effectively in many applications, they operate with a resistor in the source to ground path to supply the requisite gate voltage. This technique may be inadequate for some power amplifier applications since the resistor adversely affects the power added efficiency of the amplifier.

Other bias circuits are described in U.S. Pat. Nos. 5,724,004, 5,793,194, 5,889,426, 6,114,901, 6,304,130 and in an article entitled "A 1.9 GHz Fully Integrated PHS Power Amplifier With a Novel Automatic Gate-Bias Control Circuit", by Singh et al., published 1998 in the IEEE MTT-S Digest 0-7803-4471 5/98.

SUMMARY

In accordance with the present invention, a network is provided. The network includes an integrated circuit chip. The chip has formed thereon a current mirror comprising: a output transistor having a gate electrode for controlling a first current between a first electrode and a second electrode, the first electrode being coupled to a positive reference potential relative to ground reference potential and the second electrode being connected to the ground reference potential. The bias circuit includes a second transistor having a gate electrode for controlling a second current between a first electrode and a second electrode of the second transistor. The gate electrodes of the output and second transistors are connected together to produce the first current and the second current with equal current densities. The network includes a current source and a bias voltage producing circuit. A first portion of current from the current source is fed to the first electrode of the second transistor through a first path and a second portion of current from the current source is fed to the bias voltage producing circuit through a second path, such second portion of the current passing through the bias voltage producing circuit producing a bias voltage at the gate electrode of the output transistor, such bias voltage tracking variations in the first current passing through the output transistor.

In one embodiment, the bias voltage producing circuit is connected between the current source and a negative reference potential relative to ground potential.

In one embodiment, the network includes a current bleeding circuit connected to the bias voltage producing circuit at a point having a more negative potential than a potential at the gate electrode of the second transistor, such current bleeding circuit passing therethrough a portion of the current passing to the bias voltage producing circuit from the second path.

In one embodiment, the bias voltage producing circuit produces a negative potential or a less than 0.5 volts positive potential relative to ground reference potential.

With such an arrangement the networks include compensation for material, process, and temperature variation in the transistors of the amplifier as well as compensation for power supply voltage variation. The network is on the same chip as the amplifier. The transistors of the network will have substantially the same process and temperature variation as the transistors of the amplifier network. The bias network generates the gate voltage for the transistors of the amplifier such that material, process, and temperature variations cause a change in gate voltage of the amplifier transistors to thereby maintain the quiescent current Idq of the amplifier transistors within design specifications.

This invention is particularly for use with FET and HEMT technology where transistor pinch off voltage is negative, and Vg for proper operation is negative.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
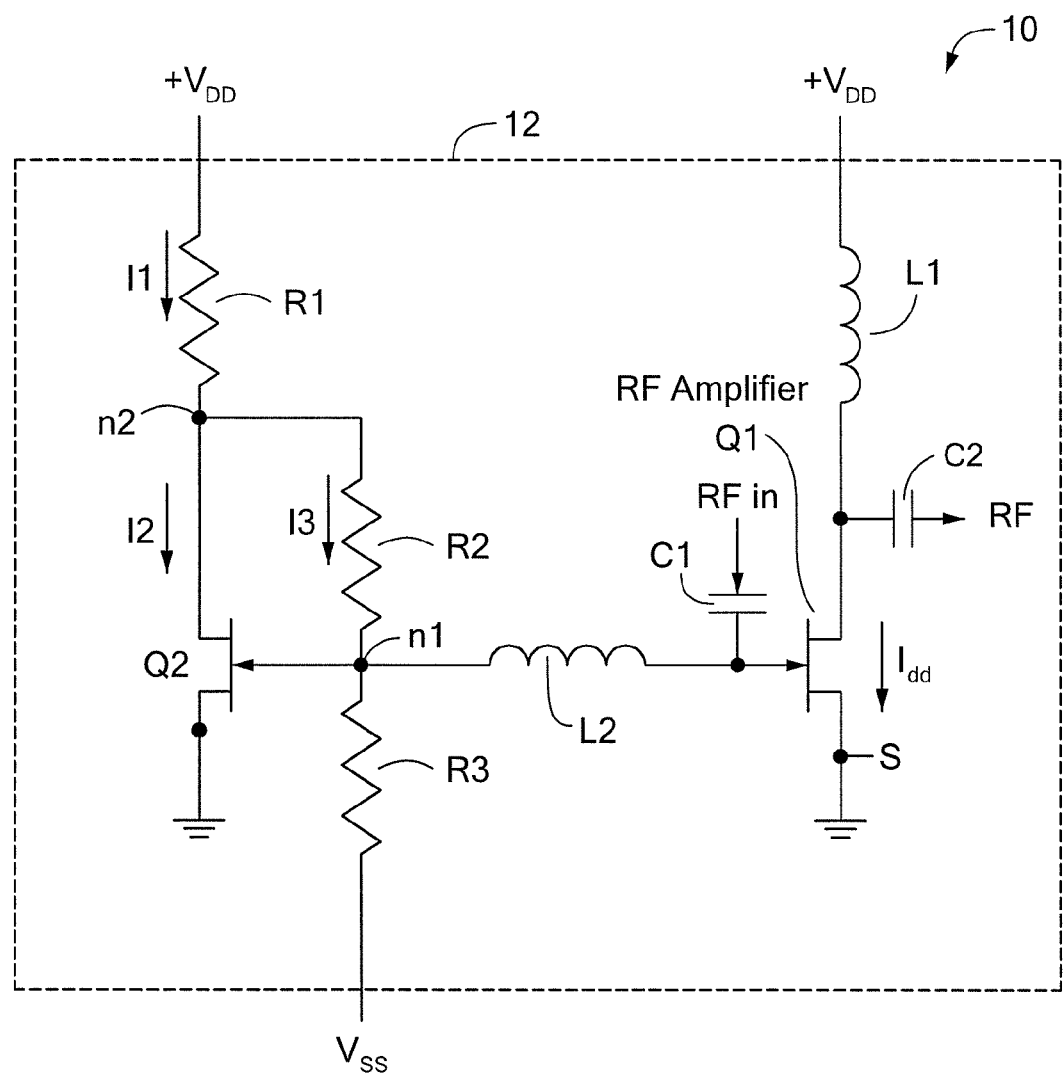
FIG. 1 is a network according to one embodiment of the invention.

Referring now to FIG. 1, a network 10 is shown. The network includes an integrated circuit chip 12. The chip 12 has formed thereon a current mirror comprising: a output transistor Q1 having a gate electrode for controlling a first current Idd between a first electrode, here a drain electrode, and a second electrode, here a source electrode. The first electrode is coupled to a positive reference potential relative to ground reference potential, here +Vdd through a radio frequency (RF) energy blocking inductor L1, and the second electrode are connected to the ground reference potential. The transistor amplifies radio frequency signals coupled to the gate electrode of transistor Q1 through a capacitor C1, as shown. The amplified radio frequency signal is output via capacitor C2, as indicated.

The bias circuit includes a second transistor Q2 having a gate electrode for controlling a second current I2 between a first electrode, here a drain electrode, and a second electrode of the second transistor, here a source electrode. The gate electrodes of the output and second transistors Q1, Q2 are connected together and are operated in saturation to produce the first current Idd and the second current I2 with equal current densities. The network includes a current source, here represented by a relatively large resistor R1 coupled +Vdd for producing a current I1. The resistor R1 is connected to the drain electrode of transistor Q2 at node n2. The bias circuit also includes a bias voltage producing circuit, here for example, a resistor divider network having a first resistor R2 connected between node n2 and the gate electrode of transistor Q2 at node n1. It is noted that the gate electrodes of transistors Q1 and Q2 are connected together through an RF blocking inductor L2. A first portion of current from the current source, portion 12, is fed to the first electrode of the second transistor Q2 through a first path and a second portion of current, portion 13, from the current source is fed to the bias voltage producing circuit through a second path, such second portion of the current passing through the bias voltage producing circuit producing a bias voltage at the gate electrode of the output transistor (at node n1), such bias voltage at node n1 tracking variations in the first current Idd passing through the output transistor Q1.

Here, the bias voltage producing circuit is connected between the current source and a negative reference potential relative to ground potential, here −Vss, as shown.

Here the bias voltage producing circuit produces a negative potential or a less than 0.5 volts positive potential relative to ground reference potential at node n1.

With such an arrangement the networks include compensation for material, process, and temperature variation in the transistors of the amplifier as well as compensation for power supply voltage variation. The network is on the same chip as the amplifier. The transistors of the network will have substantially the same process and temperature variation as the transistors of the amplifier network. The network generates the gate voltage for the transistors of the amplifier such that material, process, and temperature variations cause a change in gate voltage of the amplifier transistors to thereby maintain the quiescent current Idq of the amplifier transistors within design specifications.

This invention is particularly for use with FET and HEMT technology where transistor pinch off voltage is negative, and Vg for proper operation is negative.

It is noted that there is no source resistor for Q1. A source resistor would be detrimental to high efficiency amplifier design; the network allows for node n1 to provide a bias potential to Q1 of more than and less than '0' volts; the negative bias is provided by fixed supply Vss; Q2 and Q1 are in a current mirror configuration.

In operation, when Q1 and Q2 are operated in D.C. saturation, they would have the same current densities for ideal transistors, i.e., for the case where Q1 and Q2 are the same, the current density of Id is equal to the current density of I2. Typically Q2 is a smaller device that Q1 for amplifier bias circuits. Compensation can be realized by assuming a negative shift in threshold voltage. Id will try to increase. Current I2 will also increase. As I2 increases, I1 increase and the voltage drop across R1 increases, pulling the node n2 lower in potential. This voltage is fed back through resistor R2 to node n1 lowering the gate potential for both Q1 and Q2, keeping the bias current of Q1 in check.

Figure 2:
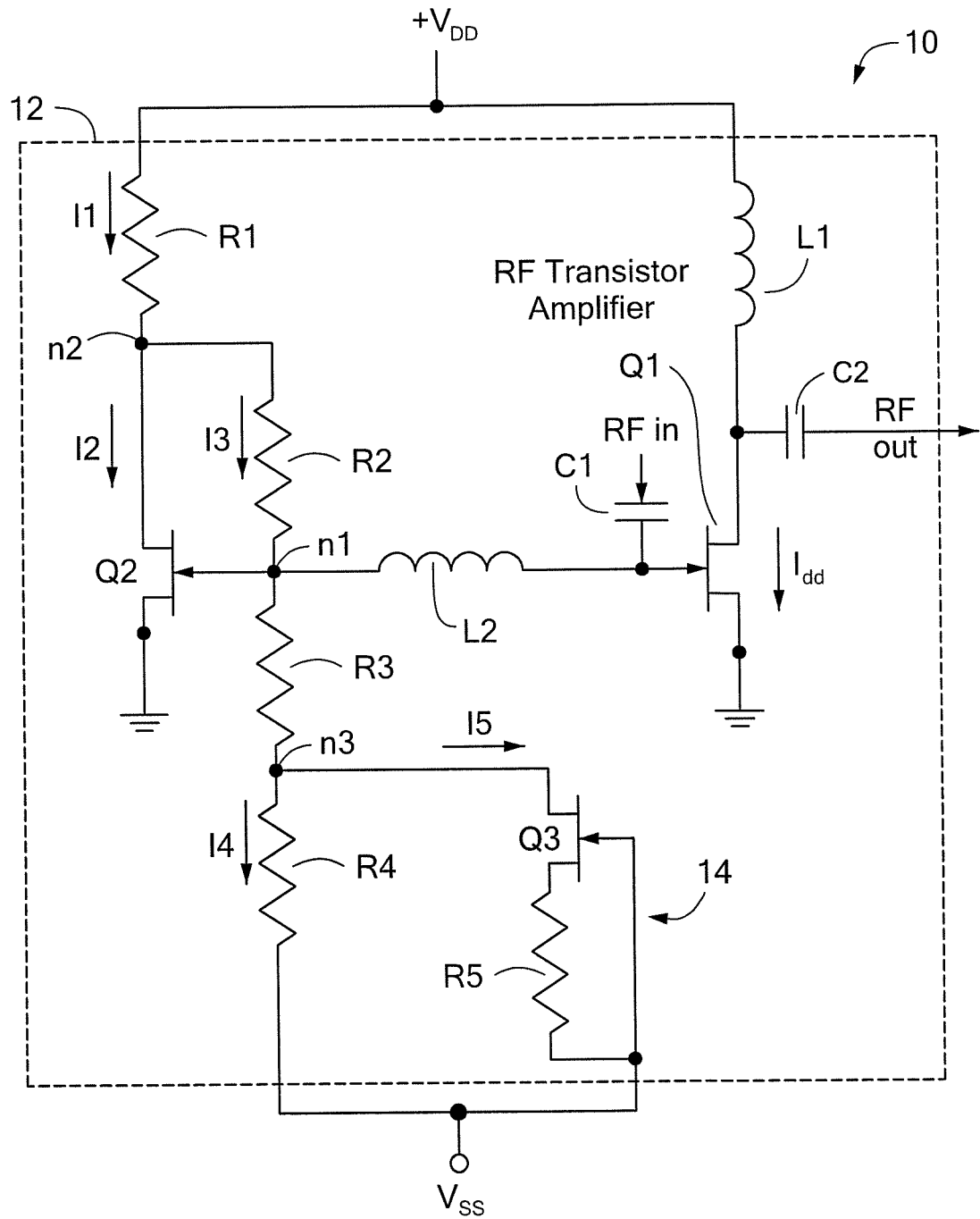
FIG. 2 is a network according to another embodiment of the invention.

Referring now to FIG. 2, the network 10' includes a current bleeding circuit 14 connected to the bias voltage producing circuit at a point having a more negative potential than a potential at the gate electrode of the second transistor, such current bleeding circuit passing therethrough a portion of the current passing to the bias voltage producing circuit from the second path.

More particularly, the circuit in FIG. 2 is similar to the circuit in FIG. 1, where Q1 and Q2 are in a mirror configuration and use the drain "Feedback" from Q2 to set node voltage n1. Here, as with the circuit in FIG. 1, there is no source resistor for Q1, thereby enabling high efficiency amplifier design. Negative bias is provided by fixed supply Vss.

The second bias compensation mechanism is added to the network includes transistor Q3 and R5, as shown. This network is inserted between node 3 and the negative supply Vss.

In operation, assume a negative shift in threshold voltage. The current I5 will increase through transistor Q3. This lowers the potential at node n3, and conversely node n1. This action reduces the gate voltage for Q2 and Q1, keeping I2 and Id in check. Thus there are two compensation mechanisms, drain feedback of Q2 and "bleeder" network of Q3 and R5, keeping Id constant.

A number of embodiments of the invention have been described. Nevertheless, it will be understood that various modifications may be made without departing from the spirit and scope of the invention. Accordingly, other embodiments are within the scope of the following claims.

What is claimed is:

1. A network, comprising:
    an integrated circuit chip, such chip having formed thereon:
        a current mirror comprising:
            an output transistor having a gate electrode for controlling a first current between a first electrode and a second electrode, the first electrode being coupled to a positive reference potential relative to ground reference potential and the second electrode being connected to the ground reference potential; and
            a second transistor having a gate electrode for controlling a second current between a first electrode and a second electrode of the second transistor;
            wherein the gate electrodes of the output and second transistors are connected together to produce the first current and the second current with equal current densities;
        a current source; and
        a bias voltage producing circuit; and
        wherein a first portion of current from the current source is fed to the first electrode of the second transistor through a first path and a second portion of current from the current source is fed to the bias voltage producing circuit through a second path, such second portion of the current passing through the bias voltage producing circuit producing a bias voltage at the gate electrode of the output transistor, such bias voltage tracking variations in the first current passing through the output transistor; and
        wherein the bias voltage producing circuit is connected between the current source and a negative reference potential relative to ground potential.

2. The network recited in claim 1 including a current bleeding circuit connected to the bias voltage producing circuit at a point having a more negative potential than a potential at the gate electrode of the second transistor, such current bleeding circuit passing therethrough a portion of the current passing to the bias voltage producing circuit from the second path.

3. A network, comprising:
integrated circuit chip, such chip having formed thereon:
   a current mirror comprising:
      an output transistor;
      a second transistor;
      such output transistor and second transistor being interconnected and operated to produce currents therethrough with equal current densities;
   a current source;
   a bias voltage producing circuit; and
   wherein a first portion of current from the current source is fed to the second transistor through a first path and a second portion of current from the current source is fed to the bias voltage producing circuit through a second path, such second portion of the current passing through the bias voltage producing circuit producing a bias voltage at a gate electrode of the output transistor, such bias voltage tracking variations in the current produced through the output transistor; and
   wherein the bias voltage producing circuit is connected between the current source and a negative reference potential relative to ground potential, and wherein the current source is connected to a positive reference potential relative to ground potential.

4. The network recited in claim 3 including a current bleeding circuit connected to the bias voltage producing circuit at a point having a more negative potential than a potential at the gate electrode of the second transistor, such current bleeding circuit passing therethrough a portion of the current passing to the bias voltage producing circuit from the second path.

5. The network recited in claim 3 wherein the output transistor and second transistor are connected between the positive reference potential relative to ground potential and ground potential.

6. The network recited in claim 5 wherein the bias voltage producing circuit is connected between the current source and a negative reference potential relative to ground potential, and wherein the current source is connected to a positive reference potential relative to ground potential.

7. The network recited in claim 6 including a current bleeding circuit connected to the bias voltage producing circuit at a point having a more negative potential than a potential at the gate electrode of the second transistor, such current bleeding circuit passing therethrough a portion of the current passing to the bias voltage producing circuit from the second path.

8. The network recited in claim 7 wherein the second transistor and the output transistor are depletion mode field effect transistors.

9. The network recited in claim 8 wherein the second transistor and the output transistor operate in saturation.

10. A network, comprising:
an integrated circuit chip, such chip having formed thereon:
   a current mirror comprising:
      an output transistor having a gate electrode for controlling a first current between a first electrode and a second electrode, the first electrode being coupled to a radio frequency signal for amplifying such signal, such first electrode providing the amplified radio frequency signal and being coupled to a positive reference potential relative to ground reference potential and the second electrode being connected to the ground reference potential; and
      a second transistor having a gate electrode for controlling a second current between a first electrode and a second electrode of the second transistor;
      wherein the gate electrodes of the output and second transistors are connected together to produce the first current and the second current with equal current densities;
   a current source; and
   a bias voltage producing circuit; and
   wherein a first portion of current from the current source is fed to the first electrode of the second transistor through a first path and a second portion of current from the current source is fed to the bias voltage producing circuit through a second path, such second portion of the current passing through the bias voltage producing circuit producing a bias voltage at the gate electrode of the output transistor, such bias voltage tracking variations in the first current passing through the output transistor; and
   wherein the bias voltage producing circuit is connected between the current source and a negative reference potential relative to ground potential.

11. The network recited in claim 10 including a current bleeding circuit connected to the bias voltage producing circuit at a point having a more negative potential than a potential at the gate electrode of the second transistor, such current bleeding circuit passing therethrough a portion of the current passing to the bias voltage producing circuit from the second path.

12. The network recited in claim 11 wherein the second transistor and the output transistor are depletion mode field effect transistors.

13. The network recited in claim 12 wherein the second transistor and the output transistor operate in saturation.

* * * * *